US006674105B2

(12) United States Patent
Iwai

(10) Patent No.: US 6,674,105 B2
(45) Date of Patent: *Jan. 6, 2004

(54) SEMICONDUCTOR MEMORY DEVICE AND METHOD OF FORMING THE SAME

(75) Inventor: Kiyotaka Iwai, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/419,307

(22) Filed: Oct. 18, 1999

(65) Prior Publication Data

US 2003/0032250 A1 Feb. 13, 2003

(30) Foreign Application Priority Data

Oct. 16, 1998  (JP) ............................. 10-294906

(51) Int. Cl.[7] ................................................ H01L 27/10
(52) U.S. Cl. ...................... 257/206; 257/903; 257/390; 257/369; 438/275; 438/981
(58) Field of Search ................ 257/903, 390, 257/206, 369; 438/275, 981

(56) References Cited

U.S. PATENT DOCUMENTS

| 4,866,002 A | | 9/1989 | Shizukuishi et al. |
|---|---|---|---|
| 5,330,929 A | | 7/1994 | Pfiester et al. |
| 5,426,065 A | * | 6/1995 | Chan et al. ............... 438/238 |
| 5,555,208 A | * | 9/1996 | Nishihara ................. 365/154 |
| 5,827,761 A | | 10/1998 | Fulford, Jr. et al. |
| 6,044,011 A | * | 3/2000 | Marr et al. ................ 365/154 |

FOREIGN PATENT DOCUMENTS

| EP | 0 157 926 A1 | 10/1985 |
|---|---|---|
| EP | 0 445 836 A1 | 9/1991 |
| JP | 53-68991 | 6/1978 |
| JP | 56-51088 | 5/1981 |
| JP | 59-172194 | 9/1984 |
| JP | 60-254653 | 12/1985 |
| JP | 60-254653 A | 12/1985 |
| JP | 10-116921 | 5/1998 |

OTHER PUBLICATIONS

Sasaki, Isao. "Micro–CMOS Process, Constituting 256KB SRAM," in *Denshi Zairyo*, vol. 24, No. 6, 1985, pp. 35–39.

* cited by examiner

*Primary Examiner*—Michael Trinh
*Assistant Examiner*—Christy Novacek
(74) *Attorney, Agent, or Firm*—Sughrue Mion, PLLC

(57) ABSTRACT

In accordance with the present invention, the gate length and the gate insulation film thickness are different between the p-channel MOS field effect transistors serving as the driver gates and the n-channel MOS field effect transistors forming the flip flop. Namely, the p-channel MOS field effect transistors serving as the driver gates have a larger gate length and a smaller gate oxide film thickness than the n-channel MOS field effect transistors forming the flip flop.

2 Claims, 16 Drawing Sheets nMOS    pMOS

SEMICONDUCTOR MEMORY DEVICE AND METHOD OF FORMING THE SAME

BACKGROUND OF THE INVENTION

The present invention relates to a semiconductor memory device and a method of forming the same, and more particularly to a static random access memory having unloaded 4 Tr complementary MOS static random access memory cells.

In order to increase the degree of integration of the 4 Tr complementary MOS static random access memory cell, it is required to scale down the MOS field effect transistors of the memory cells.

Scaling down the MOS field effect transistors causes the following two problems.

The first problem is that shortening the gate length causes a drain induced barrier lowering phenomenon whereby a stand-by current is increased.

The second problem is that reduction in thickness of the gate oxide film causes an increase in gate direct tunnel current whereby the stand-by current is increased.

In the above circumstance, it had been required to develop a novel semiconductor memory device and method of forming the same free from the above problem.

SUMMARY OF THE INVENTION

Accordingly, it is an object of the present invention to provide a novel semiconductor memory device free from the above problems.

It is a further object of the present invention to provide a novel method of forming a semiconductor memory device.

In accordance with the present invention, the gate length and the gate insulation film thickness are different between the p-channel MOS field effect transistors serving as the driver gates and the n-channel MOS field effect transistors forming the flip flop. Namely, the p-channel MOS field effect transistors serving as the driver gates have a larger gate length and a smaller gate oxide film thickness than the n-channel MOS field effect transistors forming the flip flop.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
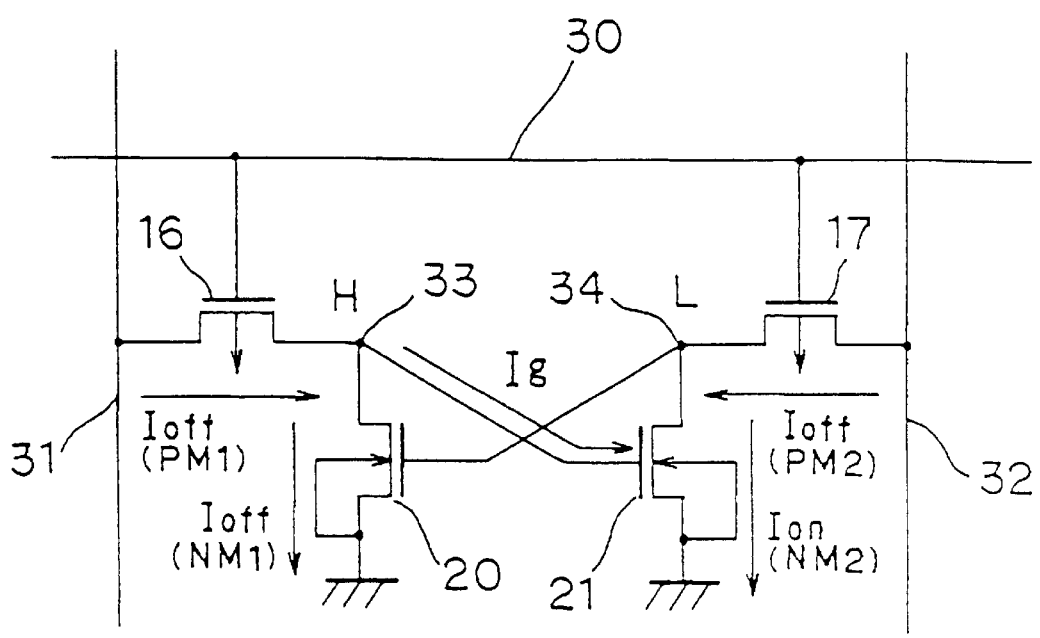
FIG. 1 is a circuit diagram illustrative of a semiconductor memory cell in a first embodiment in accordance with the present invention.

The present invention provides a semiconductor device having: at least flip flop including at least a plurality of first conductivity type channel MOS field effect transistors; and at least a driver gate comprising a second conductivity type channel MOS field transistor, wherein the first conductivity type channel MOS field effect transistors have a large gate insulation film thickness than the second conductivity type channel MOS field effect transistor.

It is preferable that the first conductivity type channel MOS field effect transistors have a smaller gate length than the second conductivity type channel MOS field effect transistor.

It is preferable that the first conductivity type channel MOS field effect transistor is an n-channel MOS field effect transistor, and the second conductivity type channel MOS field effect transistor is a p-channel MOS field effect transistor.

It is preferable that a first n-channel MOS field effect transistor is connected in series between a first node and a ground line and the first n-channel MOS field effect transistor has a gate connected to a second node; a second n-channel MOS field effect transistor is connected in series between the second node and the ground line and the second n-channel MOS field effect transistor has a gate connected to the first node; a first p-channel MOS field effect transistor is connected in series between the first node and a first bit line and the first p-channel MOS field effect transistor has a gate connected to a word line; and a second p-channel MOS field effect transistor is connected in series between the second node and a second bit line adjacent to the first bit line and the second p-channel MOS field effect transistor has a gate connected to the word line.

The second present invention provides a semiconductor device having: at least a flip flop including at least a plurality of first conductivity type channel MOS field effect transistors; and at least a driver gate comprising a second conductivity type channel MOS field effect transistor, wherein the first conductivity type channel MOS field effect transistors have a smaller gate length than the second conductivity type channel MOS field effect transistor.

It is preferable that the first conductivity type channel MOS field effect transistors have a larger gate insulation film thickness than the second conductivity type channel MOS field effect transistor.

It is also preferable that the first conductivity type channel MOS field effect transistor is an n-channel MOS field effect transistor, and the second conductivity type channel MOS field effect transistor is a p-channel MOS field effect transistor.

It is also preferable that a first n-channel MOS field effect transistor is connected in series between a first node and a ground line and the first n-channel MOS field effect transistor has a gate connected to a second node; a second n-channel MOS field effect transistor is connected in series between the second node and the ground line and the second n-channel MOS field effect transistor has a gate connected to the first node; a first p-channel MOS field effect transistor is connected in series between the first node and a first bit line and the first p-channel MOS field effect transistor has a gate connected to a word line; and a second p-channel MOS field effect transistor is connected in series between the second node and a second bit line adjacent to the first bit line and the second p-channel MOS field effect transistor has a gate connected to the word line.

The third present invention provides a semiconductor device having: at least a flip flop including at least a plurality of first conductivity type channel MOS field effect transistors; and at least a driver gate comprising a second conductivity type channel MOS field effect transistor, wherein the first conductivity type channel MOS field effect transistors have a smaller gate length than the second conductivity type channel MOS field effect transistors have a larger gate insulation film thickness than the second conductivity type channel MOS field effect transisitor.

It is preferable that the first conductivity type channel MOS field effect transistor is an n-channel MOS field effect transistor, and the second conductivity type channel MOS field effect transistor is a p-channel MOS field effect transistor.

It is preferable that a first n-channel MOS field effect transistor is connected in series between a first node and a ground line and the first n-channel MOS field effect transistor has a gate connected to a second node; a second n-channel MOS field effect transistor is connected in series between the second node and the ground line and the second n-channel MOS field effect transistor has a gate connected to the first node; a first p-channel MOS field effect transistor is connected in series between the first node and a first bit line and the first p-channel MOS field effect transistor has a gate connected to a word line; and a second p-channel MOS field effect transistor is connected in series between the second node and a second bit line adjacent to the first bit line and the second p-channel MOS field effect transistor has a gate connected to the word line.

The fourth present invention provides a method of forming a semiconductor device, comprising the steps of: selectively forming a first gate oxide film on a first conductivity type well region; entirely forming an oxide film whereby a second gate oxide film is formed on a second conductivity type well region whilst the first gate oxide film increases in thickness, so that a thickness of the first gate oxide film is thicker than a thickness of the second gate oxide film; forming a polysilicon film over the first and second gate oxide films; and patterning the polysilicon film to form a first gate electrode on the first gate oxide film and form a second gate electrode on the second gate oxide film, wherein the first gate electrode has a smaller gate length than the second gate electrode.

Preferred Embodiment

A first embodiment according to the present invention will be described in detail with reference to the drawings.

FIG. 1 is a circuit diagram illustrative of a semiconductor memory cell in a first embodiment in accordance with the present invention.

The memory cell comprises two p-channel MOS field effect transistors 16 and 17 and two n-channel MOS field effect transistors 20 and 21. The memory cell is connected to a word line 30 and adjacent two bit lines 31 and 32. In a stand-by state, the word line 30 is low level whilst the bit lines 31 and 32 are high level. The memory cell also has a first node 33 and a second node 34, wherein any one of the first and second nodes 33 and 34 is high level whilst the remaining one is low level. The p-channel MOS field effect transistors 16 and 17 form first and second driver gates respectively. If the word line 30 becomes low level, then the first and second driver gates turn ON to electrically connect the first and second nodes 33 and 34 to the first and second bit lines 31 and 32 respectively.

Detailed descriptions of the above circuit configurations will be made as follows. As described above, the first MOS field effect transistor 20 is connected in series between the first node 33 and a ground line. A gate of the first MOS field effect transistor 20 is connected to the second node 34. The second MOS field effect transistor 21 is connected in series between the second node 34 and the ground line. A gate of the second MOS field effect transistor 21 is connected to the first node 33. The third MOS field effect transistor 16 as the first driver gate is connected in series between the first bit line 31 and the first node 33, so that the gate of the second MOS field effect transistor 21 is connected through the third MOS field effect transistor 16 as the first driver gate to the first bit line 31. A gate of the third MOS field effect transistor 16 is connected to the word line 30. The fourth MOS field effect transistor 17 as the second driver gate is connected in series between the second bit line 32 and the second node 34, so that the gate of the first MOS field effect transistor 20 is connected through the fourth MOS field effect transistor 17 as the second driver gate to the second bit line 32. A gate of the fourth MOS field effect transistor 23 is connected to the word line 30.

Figure 2:
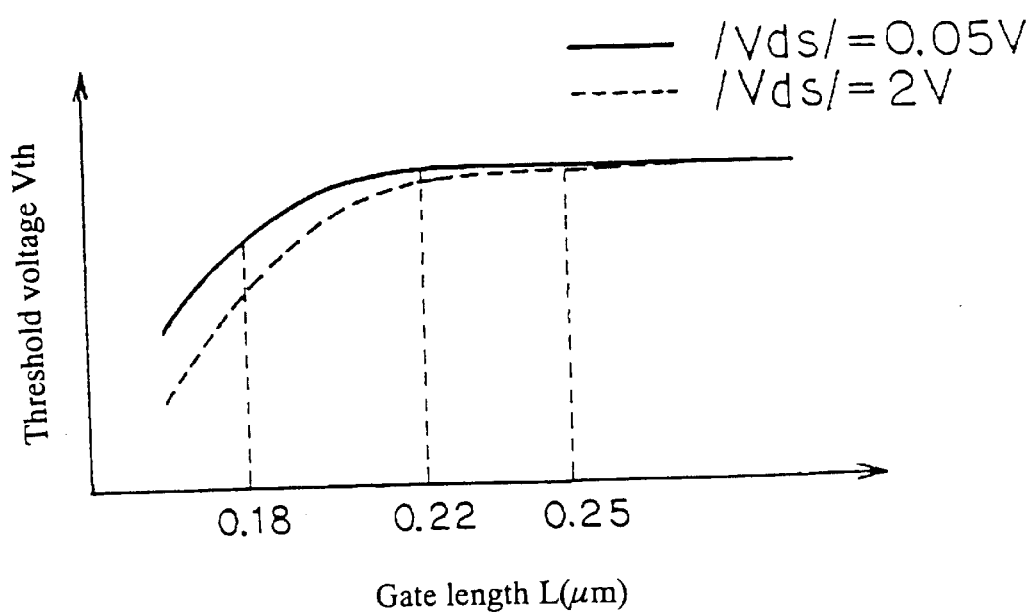
FIG. 2 is a diagram illustrative of variation in threshold voltage over gate length.
Figure 3:
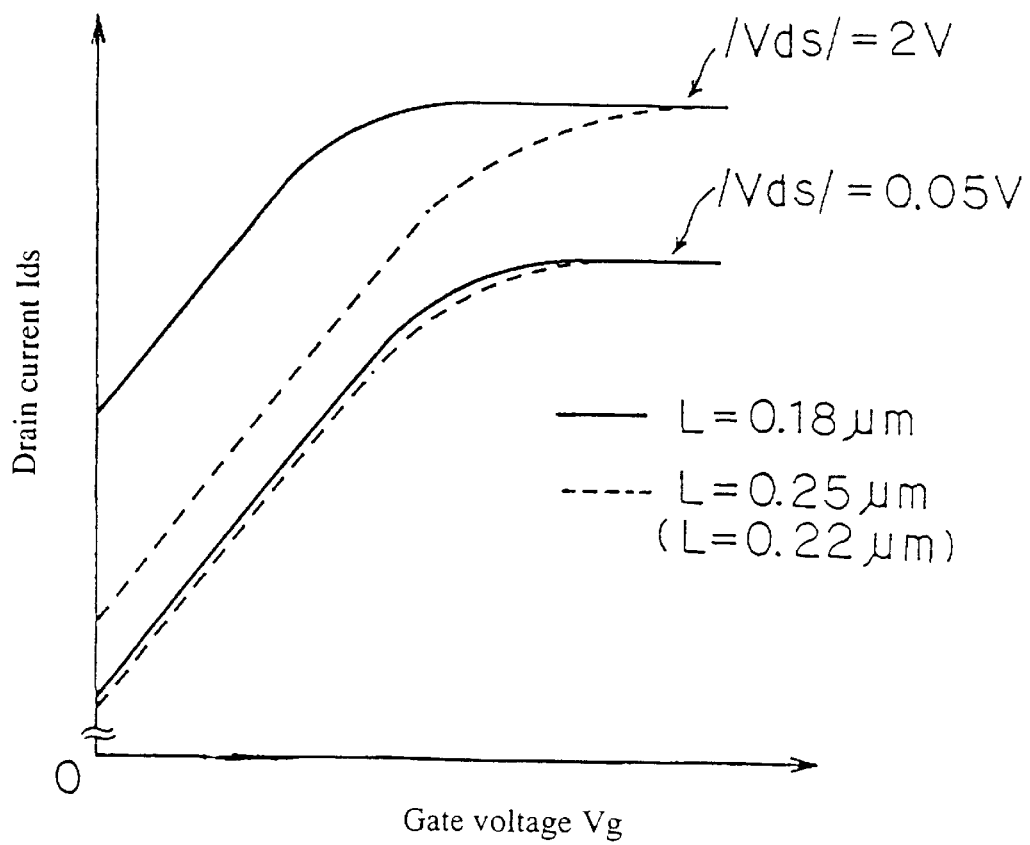
FIG. 3 is a diagram illustrative of variation in drain current over gate voltage.
Figure 4:
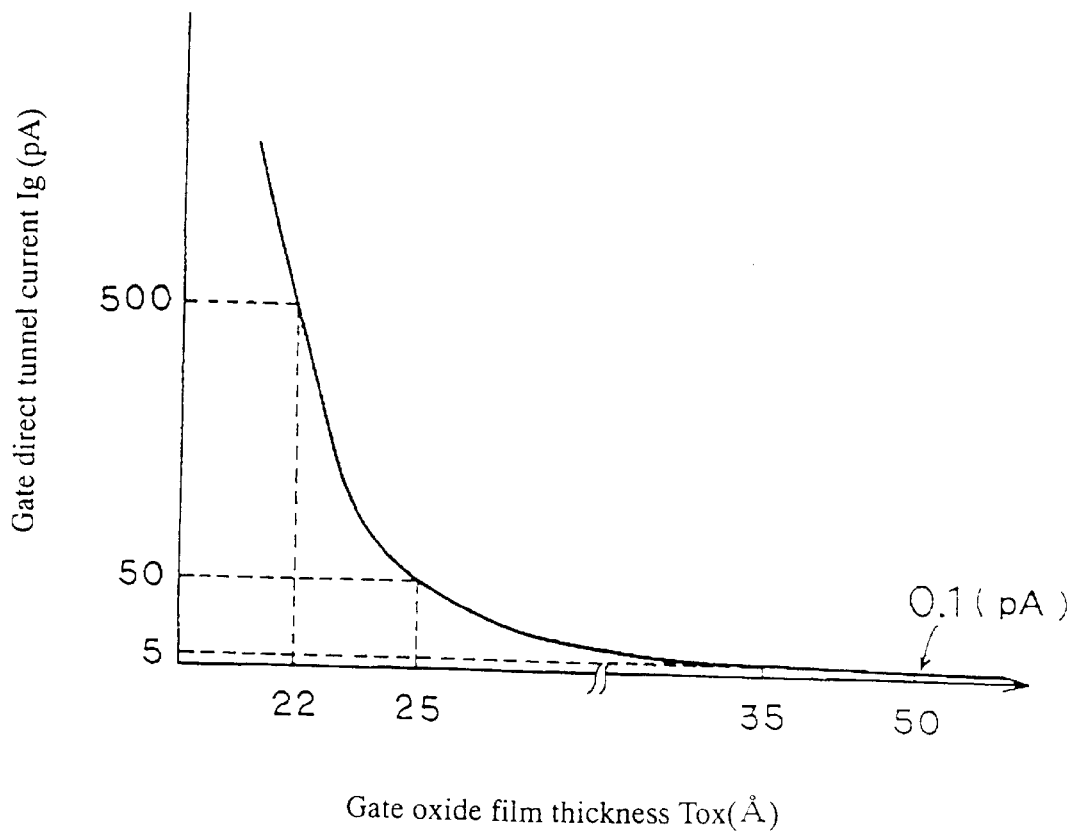
FIG. 4 is a diagram illustrative of variation in gate direct tunnel current over gate oxide film thickness.

FIG. 2 is a diagram, illustrative of variation in threshold voltage over gate length. The p-channel MOS field effect transistors 16 and 17 have a larger gate length. As illustrated in FIG. 2, the enlargement in gate length of the p-channel MOS field effect transistors 16 and 17 reduces a difference in threshold voltage depending upon a source-drain voltage Vds. FIG. 3 is a diagram illustrative of variation in drain current over gate voltage. FIG. 4 is a diagram illustrative of variation in gate direct tunnel current over gate oxide film thickness. As illustrated in FIG. 3, the reduction in difference in threshold voltage also reduces a difference in off-current depending upon the source-drain voltage Vds. For those reasons, the gate length of the p-channel MOS field effect transistors of the driver gates is enlarged to suppress a drain induced barrier lowering phenomenon, so as to reduce as many as possible variations in off-current due to a source drain voltage. A ratio of the off-current of the p-channel MOS field effect transistor 17 to an off-current Ioff(PM1) of the p-channel MOS field effect transistor 16 is made small, resulting in that the of-current Ioff(PM2) of the p-channel MOS field effect transistor 17 is made small. Thus, the stand-by current is reduced.

The drain induced barrier lowering phenomenon will be described. With reference to FIG. 2, if the gate length is shorter than a predetermined length, then short channel effects are caused to reduce a threshold voltage. Increase in source-drain voltage causes the drain induced barrier lowering phenomenon whereby he threshold voltage is further and largely dropped. For those reasons, shortening the gate length causes increase in the source-drain voltage whereby a remarkable reduction in threshold voltage is caused.

With reference to FIG. 3, the drain current flowing through the source and drain depends on a difference between the gate voltage and a the threshold voltage, for which reason a decrease in threshold voltage causes an increase in drain current under the same gate voltage. If the gate length is small, then the threshold voltage varies depending upon the variation in the drain current. Thus, the off-current as the drain current under the zero gate voltage application may largely vary depending upon the drain current provided that the gate length is short. Therefore, shortening the gate length cause the drain induced barrier lowering phenomenon whereby the standby current is increased.

Further, the gate length and the gate oxide film thickness causes an increase in gate direct tunnel current Ig whereby the first p-channel MOS field effect transistor is required to have an increased off-current, resulting in that the off-current of the second p-channel MOS field effect transistor is increased. Therefore, the stand-by current is also increased.

The reduction in the thickness of the gate oxide film under a predetermined thickness causes a rapid increase in gate direct tunnel current Ig. With reference to FIG. 4, the gate oxide film is reduced in thickness under 25 angstroms, then the gate direct tunnel current is rapidly increased, whereby the stand-by current is also increased.

If the p-channel MOS field effect transistors have a gate oxide film thickness of 35 angstroms and the gate length of 0.18 micrometers, and the n-channel MOS field effect transistors have a gate oxide film thickness of 35 angstroms and the gate length of 0.18 micrometers, then the off-current Ioff(PM2) of the p-channel MOS field effect transistor 17 is 500 pA, and the off-current Ioff(PM1) of the p-channel MOS field effect transistor 16 is 100 pA, and the off-current Ioff(NM1) of the n-channel MOS field effect transistor is 50 pA, and a gate direct tunnel current Ig is 5 pA.

If the p-channel MOS field effect transistors have a gate oxide film thickness of 35 angstroms and the gate length of 0.22 micrometers, and the n-channel MOS field effect transistors have a gate oxide film thickness of 35 angstroms and the gate length of 0.18 micrometers, then the off-current Ioff(PM2) of the p-channel MOS field effect transistor 17 is 200 pA, and the off-current Ioff(PM1) of the p-channel MOS field effect transistor 16 is 100 pA, and the off-current Ioff(NM1) of the n-channel MOS field effect transistor is 50 pA, and a gate direct tunnel current Ig is 5 pA.

If the p-channel MOS field effect transistors have a gate oxide film thickness of 22 angstroms and the gate length of 0.13 micrometers, and the n-channel MOS field effect transistors have a gate oxide film thickness of 22 angstroms and the gate length of 0.13 micrometers, then the off-current Ioff(PM2) of the p-channel MOS field effect transistor 17 is 5000 pA, and the off-current Ioff(PM1) of the p-channel MOS field effect transistor 16 is 1000 pA, and the off-current Ioff(NM1) of the n-channel MOS field effect transistor is 50 pA, and a gate direct tunnel current Ig is 500 pA.

If the p-channel MOS field effect transistors have a gate oxide film thickness of 22 angstroms and the gate length of 0.16 micrometers, and the n-channel MOS field effect transistors have a gate oxide film thickness of 22 angstroms and the gate length of 0.13 micrometers, then the off-current Ioff(PM2) of the p-channel MOS field effect transistor 17 is 2000 pA, and the off-current Ioff(PM1) of the p-channel MOS field effect transistor 16 is 1000 pA, and the off-current Ioff(NM1) of the n-channel MOS field effect transistor is 50 pA, and a gate direct tunnel current Ig is 500 pA.

If the gate length of the p-channel MOS field effect transistors is changed from 0.18 micrometers to 0.22 micrometers without changing the gate oxide film thickness, then the drain induced barrier lowering phenomenon is suppressed to reduce the off-current (Ioff(PM2)) to 200 pA which is double of the off-current (Ioff(PM1)), whereby the stand-by current is reduced.

If also the gate length of the p-channel MOS field effect transistors is changed from 0.13 micrometers to 0.16 micrometers without changing the gate oxide film thickness, then the drain induced barrier lowering phenomenon is suppressed to reduce the off-current (Ioff(PM2)) to 2000 pA which is double of the off-current (Ioff(PM1)), whereby the stand-by current is reduced.

A second embodiment according to the present invention will be described in detail with reference to the drawings.

Figure 5:
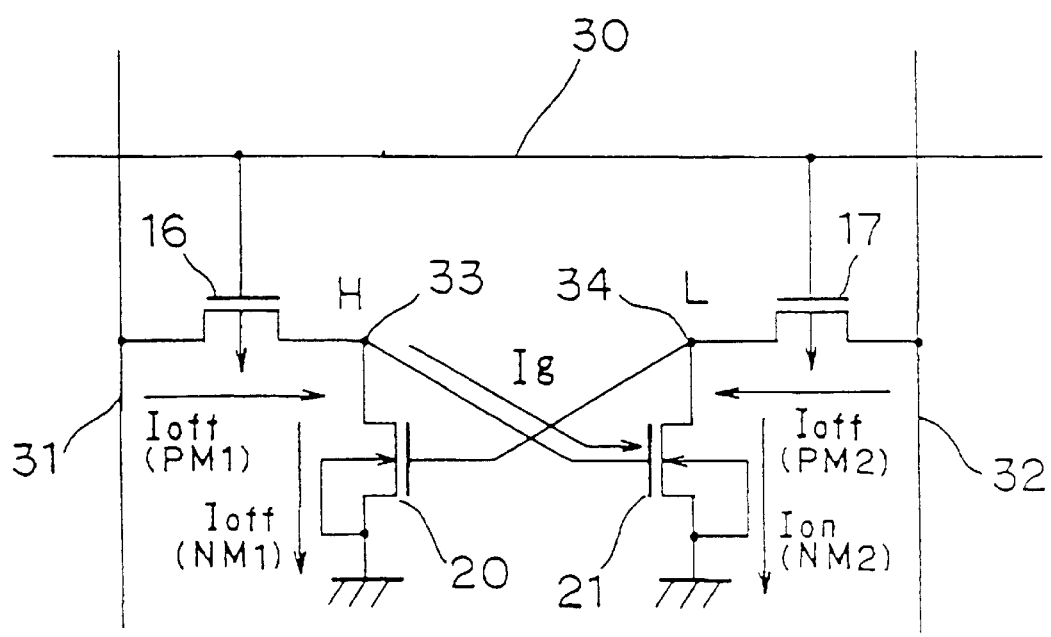
FIG. 5 is a circuit diagram illustrative of a semiconductor memory cell in a second embodiment in accordance with the present invention

FIG. 5 is a circuit diagram illustrative of a semiconductor memory cell in a second embodiment in accordance with the present invention.

The memory cell comprises two p-channel MOS field effect transistors 16 and 17 and two n-channel MOS field effect transistors 20 and 21. The memory cell is connected to a word line 30 and adjacent two bit lines 31 and 32. In a stand-by state, the word line 30 is low level whilst the bit lines 31 and 32 are high level. The memory cell also has a first node 33 and a second node 34, wherein any one of the first and second nodes 33 and 34 is high level whilst the remaining one is low level. The p-channel MOS field effect transistors 16 and 17 form first and second driver gates respectively. If the word line 30 becomes low level, then the first and second driver gates turn ON to electrically connect the first and second nodes 33 and 34 to the first and second bit lines 31 and 32 respectively.

Detailed descriptions of the above circuit configurations will be made as follows. As described above, the first MOS field effect transistor 20 is connected in series between the first node 33 and a ground line. A gate of the first MOS field effect transistor 20 is connected to the second node 34. The second MOS field effect transistor 21 is connected in series between the second node 34 and the ground line. A gate of the second MOS field effect transistor 21 is connected to the first node 33. The third MOS field effect transistor 16 as the first driver gate is connected in series between the first bit line 31 and the first node 33, so that the gate of the second MOS field effect transistor 21 is connected through the third MOS field effect transistor 16 as the first driver gate to the first bit line 31. A gate of the third MOS field effect transistor 16 is connected to the word line 30. The fourth MOS field effect transistor 17 as the second driver gate is connected in series between the second bit line 32 and the second node 34, so that the gate of the first MOS field effect transistor 20 is connected through the fourth MOS field effect transistor 17 as the second driver gate to the second bit line 32. A gate of the fourth MOS field effect transistor 23 is connected to the word line 30.

FIG. 2 is a diagram illustrative of variation in threshold voltage over gate length. The p-channel MOS field effect transistors 16 and 17 have a larger gate oxide film thickness than the n-channel MOS field effect transistors 20 and 21. As illustrated in FIG. 4, the enlargement in gate oxide film thickness of the p-channel MOS field effect transistors 16 and 17 reduces the gate direct tunnel current Ig, whereby enlargement in thickness of the gate oxide films of the n-channel MOS field effect transistors only reduces the gate direct tunnel current Ig, so that the off-current Ioff(PM1) of the p-channel MOS field effect transistor 16 is made small, resulting in that the of-current Ioff(PM2) of the p-channel MOS field effect transistor 17 is made small. Thus, the stand-by current is reduced. FIG. 4 is a diagram illustrative of variation in gate direct tunnel current over gate oxide film thickness.

If the p-channel MOS field effect transistors have a gate oxide film thickness of 22 angstroms and the gate length of 0.13 micrometers, and the n-channel MOS field effect transistors have a gate oxide film thickness of 22 angstroms and the gate length of 0.13 micrometers, then the off-current Ioff(PM2) of the p-channel MOS field effect transistor 17 is 5000 pA, and the current Ioff(PM1) of the p-channel MOS field effect transistor 16 is 1000 pA, and the off-current Ioff(NM1) of the n-channel MOS field effect transistor is 50 pA, and a gate direct tunnel current Ig is 500 pA.

If the p-channel MOS field effect transistors have a gate oxide film thickness of 22 angstroms and the gate length of 0.13 micrometers, and the n-channel MOS field effect transistors have a gate oxide film thickness of 25 angstroms and the gate length of 0.13 micrometers, then the off-current Ioff(PM2) of the p-channel MOS field effect transistor 17 is 1000 pA, and the off-current Ioff(PM1) of the p-channel MOS field effect transistor 16 is 200 pA, and the off-current Ioff(NM1) of the n-channel MOS field effect transistor is 50 pA, and a gate direct tunnel current Ig is 50 pA.

If the gate oxide film thickness of the n-channel MOS field effect transistors is changed from 22 angstroms to 25 angstroms without changing the gate length, then the gate direct tunnel current Ig is reduced from 500 pA to 50 pA to reduce the off-current (Ioff(PM1)) to 200 pA and thus reduce the off-current (Ioff(PM2)) to 1000 pA which is one fifth of the conventional one's 5000 pA, whereby the stand-by current is reduced.

A third embodiment according to the present invention will be described in detail with reference to the drawings.

Figure 6:
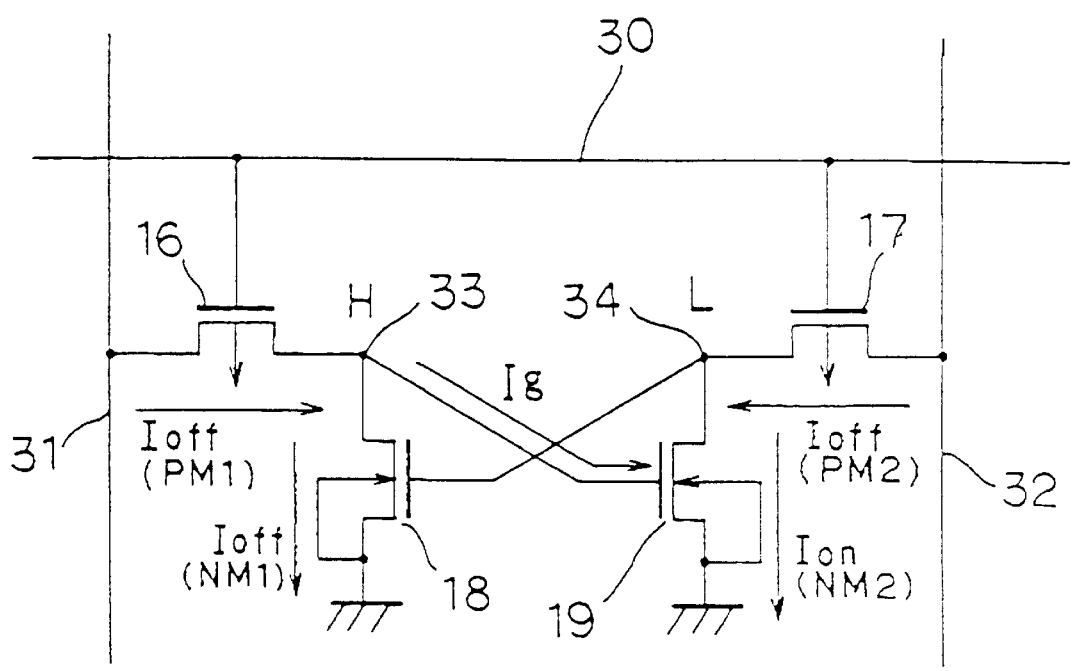
FIG. 6 is a circuit diagram illustrative of a semiconductor memory cell in a third embodiment in accordance with the present invention.

FIG. 6 is a circuit diagram illustrative of a semiconductor memory cell in a third embodiment in accordance with the present invention.

The memory cell comprises two p-channel MOS field effect transistors 16 and 17 and two n-channel MOS field effect transistors 20 and 21. The memory cell is connected to a word line 30 and adjacent two bit lines 31 and 32. In a stand-by state, the word line 30 is low level whilst the bit lines 31 and 32 are high level. The memory cell also has a first node 33 and a second node 34, wherein any one of the first and second nodes 33 and 34 is high level whilst the remaining one is low level. The p-channel MOS field effect transistors 16 and 17 form first and second driver gates respectively. If the word line 30 becomes low level, then the first and second driver gates turn ON to electrically connect the first and second nodes 33 and 34 to the first and second bit lines 31 and 32 respectively.

Detailed descriptions of the above circuit configurations will be made as follows. As described above, the first MOS field effect transistor 20 is connected in series between the first node 33 and a ground line. A gate of the first MOS field effect transistor 20 is connected to the second node 34. The second MOS field effect transistor 21 is connected in series between the second node 34 and the ground line. A gate of the second MOS field effect transistor 21 is connected to the first node 33. The third MOS field effect transistor 16 as the first driver gate is connected in series between the first bit line 31 and the first node 33, so that the gate of the second MOS field effect transistor 21 is connected through the third MOS field effect transistor 16 as the first driver gate to the first bit line 31. A gate of the third MOS field effect transistor 16 is connected to the word line 30. The fourth MOS field effect transistor 17 as the second driver gate is connected in series between the second bit line 32 and the second node 34, so that the gate of the first MOS field effect transistor 20 is connected through the fourth MOS field effect transistor 17 as the second driver gate to the second bit line 32. A gate of the fourth MOS field effect transistor 23 is connected to the word line 30.

The p-channel MOS field effect transistors 16 and 17 have a larger gate length than the n-channel MOS field effect transistors 18 and 19. The n-channel MOS field effect transistors 18 and 19 have a thicker gate oxide film thickness than the p-channel MOS field effect transistors 16 and 17. As illustrated in FIG. 2, the enlargement in gate length of the p-channel MOS field effect transistors 16 and 17 reduces a difference in threshold voltage depending upon a source-drain voltage Vds. As illustrated in FIG. 3, the reduction in difference in threshold voltage also reduces a difference in off-current depending upon the source-drain voltage Vds. For those reasons, the gate length of the p-channel MOS field effect transistors of the driver gates is enlarged to suppress a drain induced barrier lowering phenomenon, so as to reduce as many as possible variations in off-current due to a source drain voltage. A ratio of the off-current of the p-channel MOS field effect transistor 17 to an off-current Ioff(PM1) of the p-channel MOS field effect transistor 16 is made small, resulting in that the of-current Ioff(PM2) of the p-channel MOS field effect transistor 17 is made small. Thus, the stand-by current is reduced.

As illustrated in PIG. 4, the enlargement in gate oxide film thickness of the p-channel MOS field effect transistors 16 and 17 reduces the gate direct tunnel current Ig, whereby enlargement in thickness of the gate oxide films of the n-channel MOS field effect transistors only reduces the gate direct tunnel current Ig, so that the off-current Ioff(PM1) of the p-channel MOS field effect transistor 16 is made small, resulting in that the of-current Ioff(PM2) of the p-channel MOS field effect transistor 17 is made small. Thus, the stand-by current is largely reduced.

If the p-channel MOS field effect transistors have a gate oxide film thickness of 22 angstroms and the gate length of 0.13 micrometers, and the n-channel MOS field effect transistors have a gate oxide film thickness of 22 angstroms and the gate length of 0.13 micrometers, then the off-current Ioff(PM2) of the p-channel MOS field effect transistor 17 is 5000 pA, and the off-current Ioff(PM1) of the p-channel MOS field effect transistor 16 is 1000 pA, and the off-current Ioff(NM1) of the n-channel MOS field effect transistor is 50 pA, and a gate direct tunnel current Ig is 500 pA.

If the p-channel MOS field effect transistors have a gate oxide film thickness of 22 angstroms and the gate length of 0.16 micrometers, and the n-channel MOS field effect transistors have a gate oxide film thickness of 25 angstroms and the gate length of 0.13 micrometers, then the off-current Ioff(PM2) of the p-channel MOS field effect transistor 17 is 400 pA, and the off-current Ioff(PM1) of the p-channel MOS field effect transistor 16 is 200 pA, and the off-current Ioff(NM1) of the n-channel MOS field effect transistor is 50 pA, and a gate direct tunnel current Ig is 50 pA If the gate length of the p-channel MOS field effect transistors is changed from 0.13 micrometers to 0.16 micrometers and the gate oxide film thickness of the n-channel MOS field effect transistors is changed from 22 to 25, then the drain induced barrier lowering phenomenon is suppressed to reduce the off-current (Ioff(PM2)) to 400 pA which is double of the off-current (Ioff(PM1)), whereby the stand-by current is reduced. Further, the gate direct tunnel current Ig is reduced from 500 pA to 50 pA to reduce the off-current (Ioff(PM1)) to 200 pA and thus reduce the off-current (Ioff(PM2)) to 400 pA which is smaller than one twelfth of the conventional one's 5000 pA, whereby the stand-by current is largely reduced.

In accordance with the present invention, the gate length and the gate insulation film thickness are different between the p-channel MOS field effect transistors serving as the driver gates and the n-channel MOS field effect transistors forming the flip flop. Namely, the p-channel MOS field effect transistors serving as the driver gates have a larger gate length and a smaller gate oxide film thickness than the n-channel MOS field effect transistors forming the flip flop.

FIGS. 7A through 7J are fragmentary cross sectional elevation views illustrative of semiconductor devices in sequential steps involved in a novel method in accordance with the present invention.

Figure 7A:
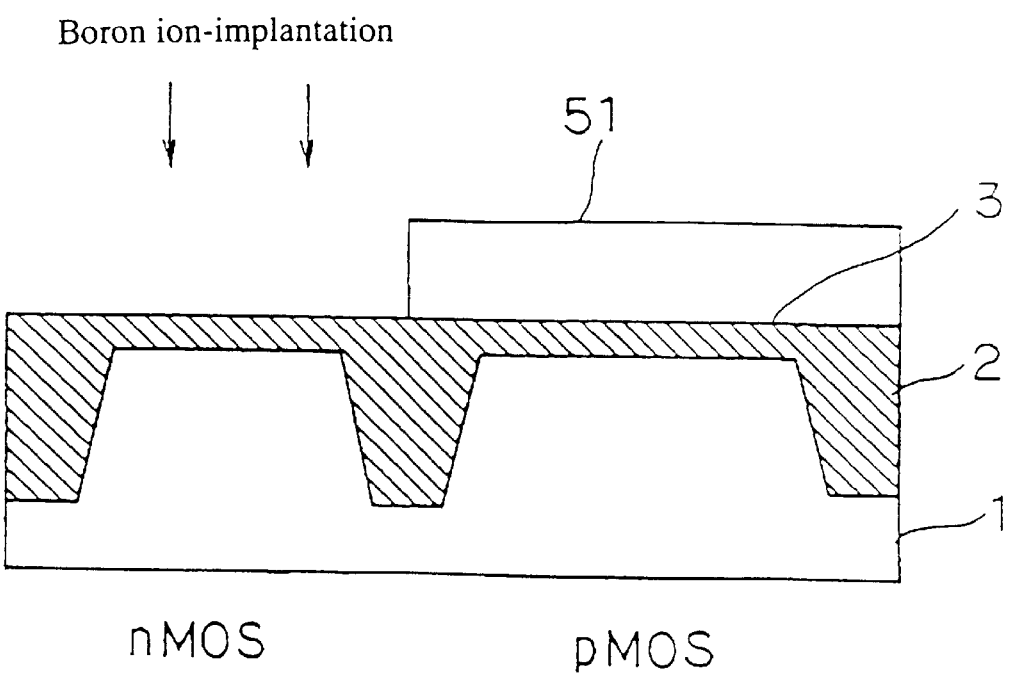
FIGS. 7A through 7J are fragmentary cross sectional elevation views illustrative of semiconductor devices in sequential steps involved in a novel method in accordance with the present invention.

With reference to FIG. 7A, isolations 2 and a dummy oxide film 3 are formed on a p-type silicon substrate 1. A resist 51 is selectively formed on the surface of the dummy oxide film 3, so that a boron ion-implantation is carried out by use of the resist 51 as a mask to form a p-well region 4.

Figure 7B:
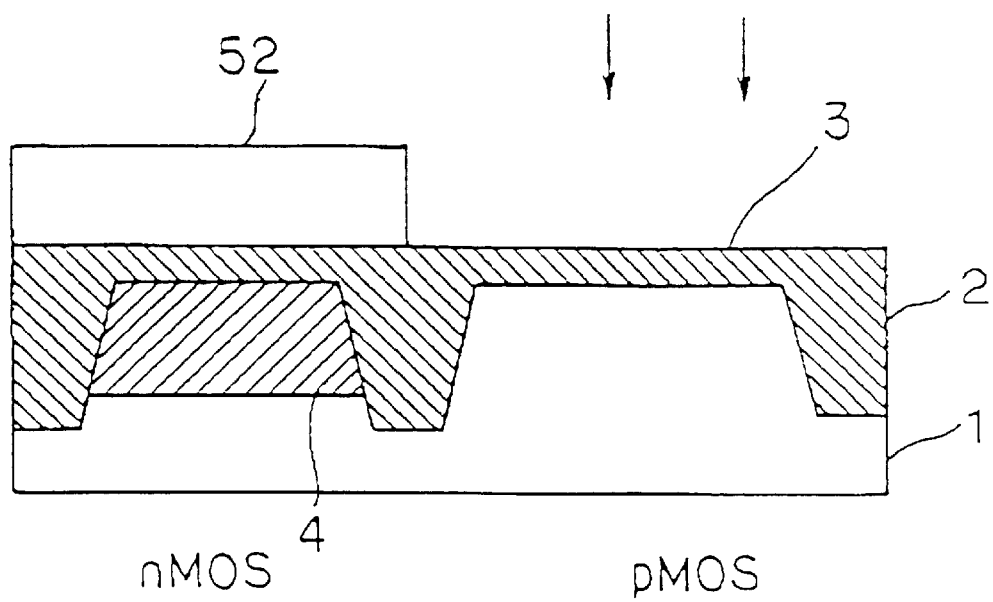

With reference to FIG. 7B, the above used resist 51 has been removed, another resist 52 is selectively formed on the surface of the dummy oxide film 3, so that an arsenic ion-implantation is carried out by use of the resist 52 as a mask to form an n-well region 5.

Figure 7C:
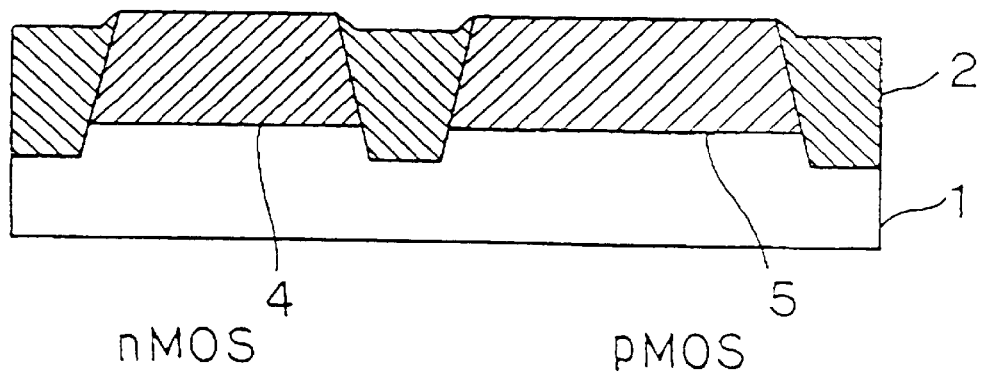

With reference to FIG. 7C, the above used resist 52 has been removed, and the dummy oxide film 3 is removed by an etching, so that the tops of the n-well 5 and the p-well 4 are shown.

Figure 7D:
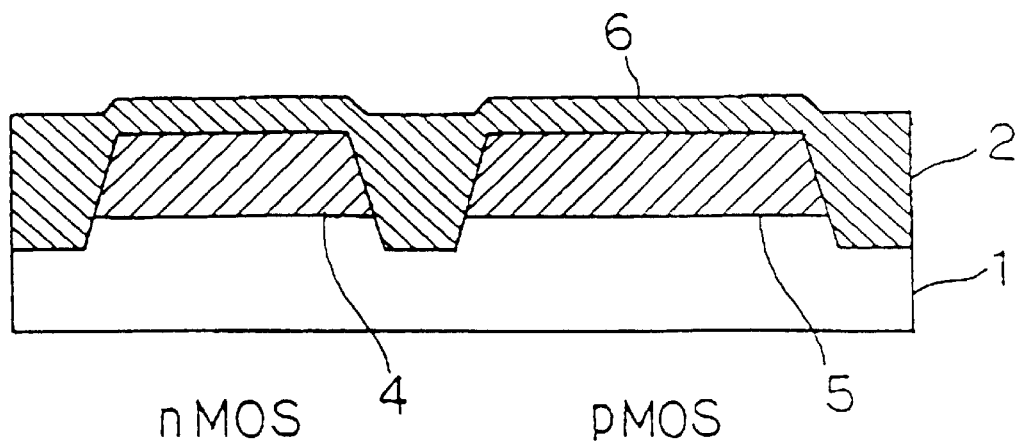

With reference to FIG. 7D, a first gate oxide film 6 having a thickness of 20 angstroms is formed over the tops of the n-well 5 and the p-well 4.

Figure 7E:
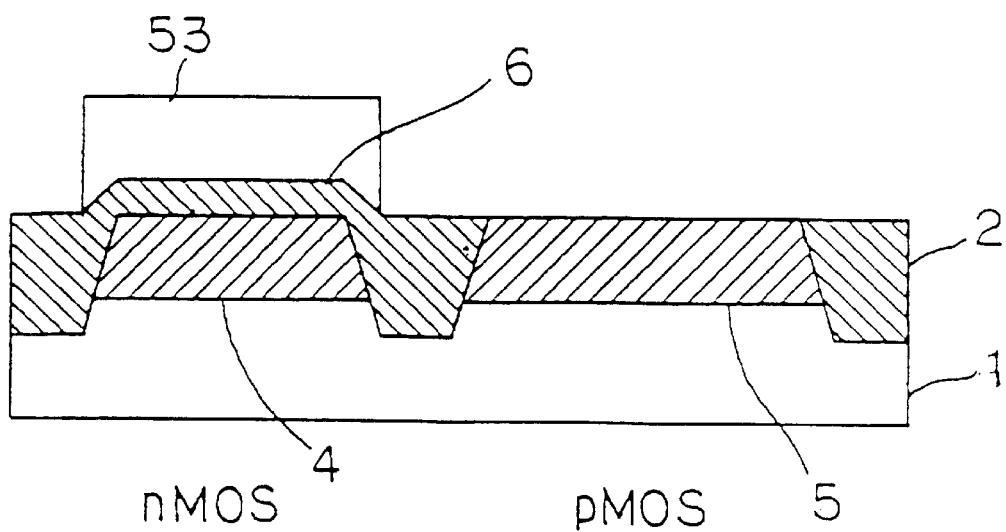

With reference to FIG. 7E, a resist 53 is selectively formed on the first gate oxide film 6 before an uncovered portion of the first gate oxide film 6 is then etched, whilst the covered portion under the resist 53 remains to have the thickness of 20 angstroms.

Figure 7F:
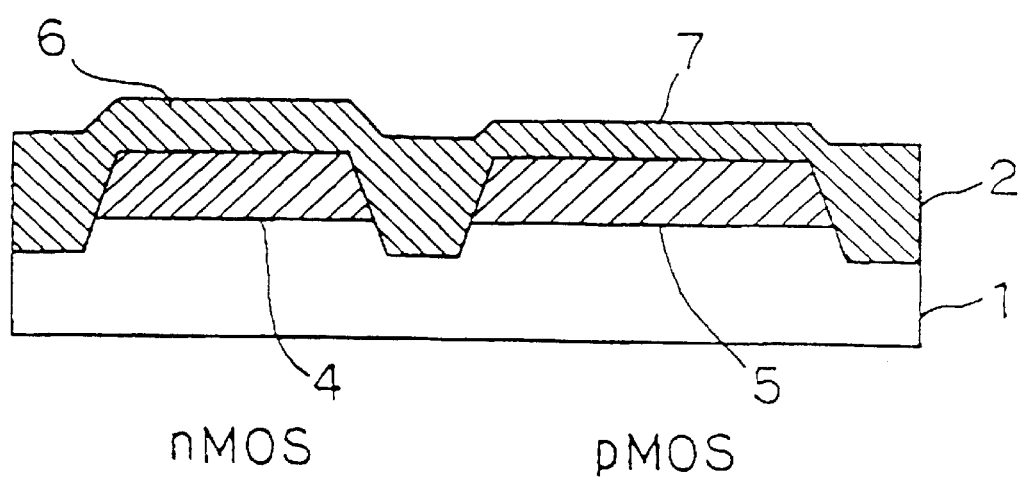

With reference to FIG. 7F, after the resist 53 has been removed, then a second gate oxide film 7 having a thickness of 22 angstroms is formed on the top of the p-well 5, whereby the thickness of the first gate oxide film 6 is increased to 25 angstroms.

Figure 7G:
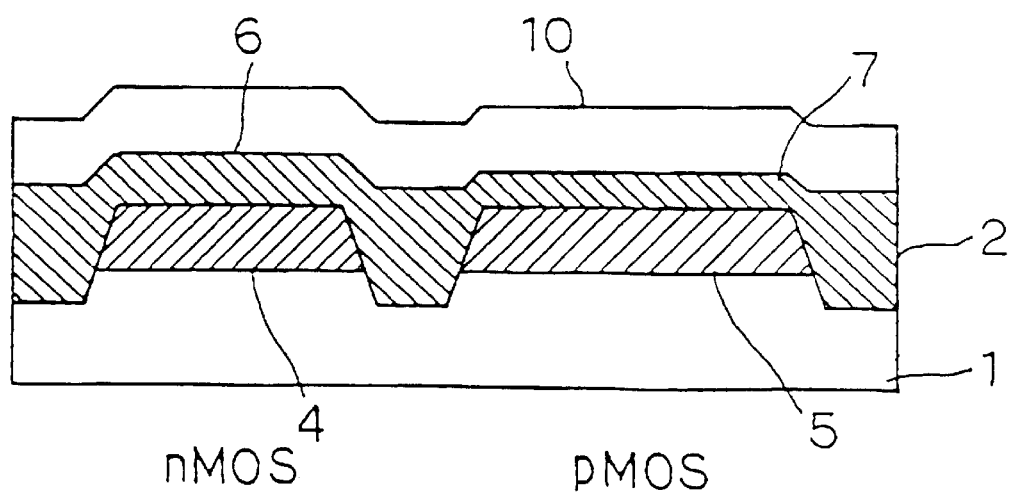

With reference to FIG. 7G, a polysilicon film 10 is formed which extends over the first and second gate oxide films 6 and 7 as well as the field oxide films 2.

Figure 7H:
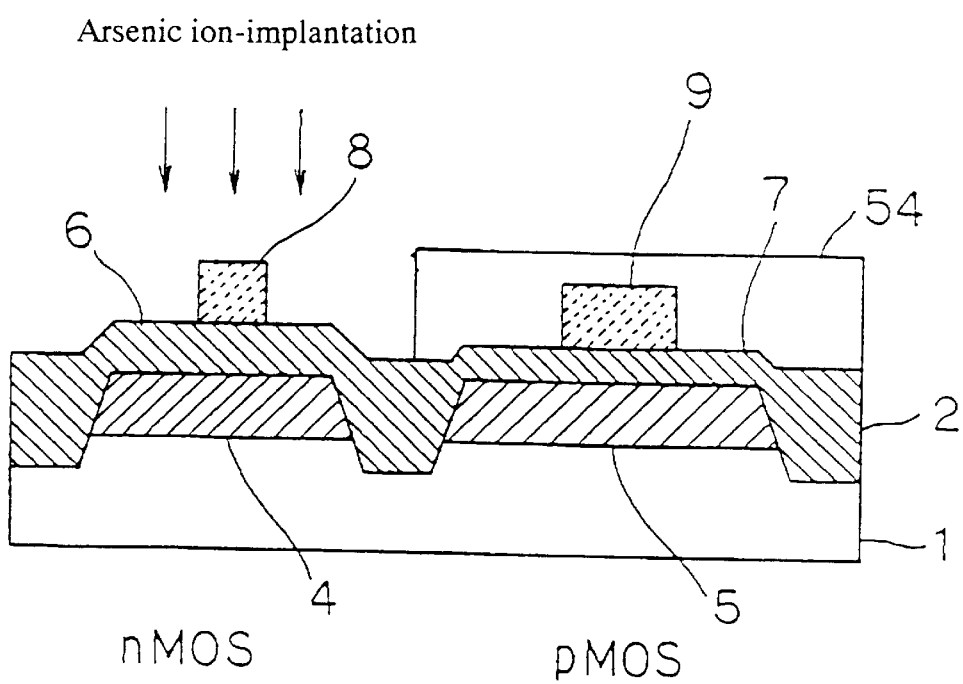

With reference to FIG. 7H, the polysilicon film 10 is pattered to form first and second gate electrodes 8 and 9, wherein the first gate electrode 8 is positioned over the first gate insulation film 6 and the second gate electrode 9 is positioned over the second gate insulation film 7. The first gate electrode 8 has a gate length of 0.13 micrometers. The second gate electrode 9 has a gate length of 0.16 micrometers. A resist 54 is formed over the second gate electrode 9 and the second gate insulation film 7. An arsenic ion-implantation is carried out by use of the resist 54 as a mask to implant arsenic into the first gate electrode 8 and first source and drain regions 11 in the n-well region 4.

Figure 7I:
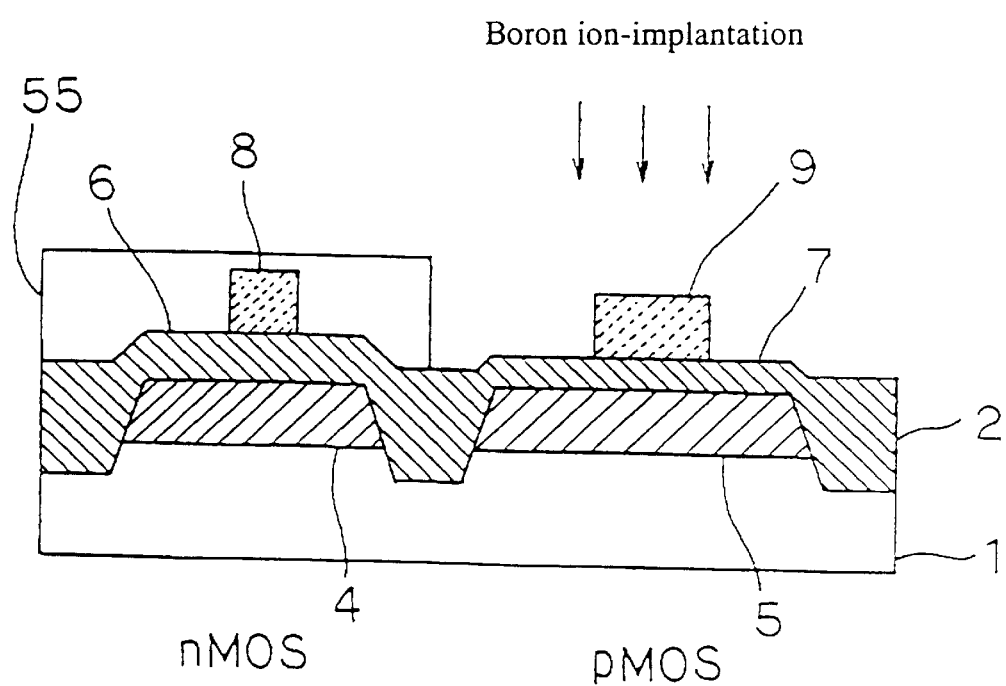

With reference to FIG. 7I, the used resist 54 has been removed, and then a resist 55 is selectively formed over the first gate electrode 8 and the first gate insulation film 6. A boron ion-implantation is carried out by use of the resist 55 as a mask to implant boron into the second gate electrode 9 and second source and drain regions 12 in the p-well region 5.

Figure 7J:
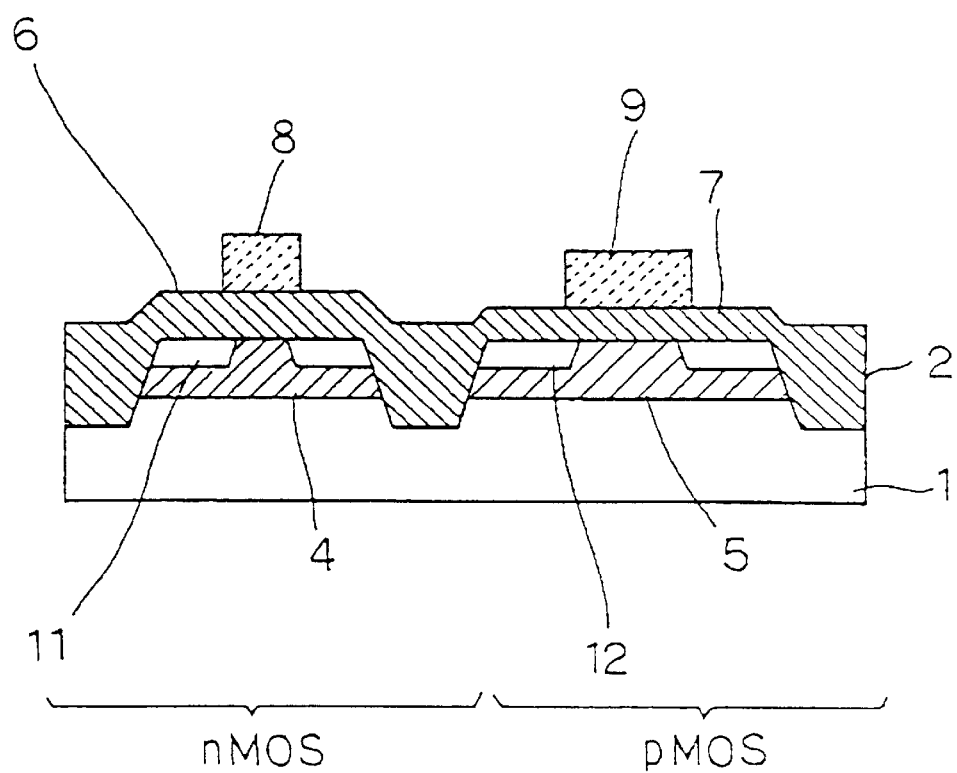

With reference to FIG. 7J, the used resist 55 has been removed, whereby the n-channel MOS field effect transistor and the p-channel MOS field effect transistor are formed, wherein the gate length and the gate oxide film thickness are different between the n-channel MOS field effect transistor and the p-channel MOS field effect transistor.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A static random access memory including:

a first n-channel MOS field effect transistor being connected in series between a first node and a ground line and said first n-channel MOS field effect transistor having a gate connected to a second node, and said first node having a voltage supplied by only said ground line or a first bit line;

a second n-channel MOS field effect transistor being connected in series between a second node and the ground line and said second n-channel MOS field effect transistor having a gate connected to the first node, and said second node having a voltage supplied by only said ground line or a second bit line;

a first p-channel MOS field effect being connected in series between the first node and said first bit line and said first p-channel MOS field effect transistor having a gate connected to a word line; and a second p-channel MOS field effect being connected in series between the second node and said second bit line adjacent to said first bit line and said second p-channel MOS field effect transistor having a gate connected to said word line, wherein said first and second n-channel MOS field effect transistors have gate insulation films that are thicker than gate insulation films of said first and second p-channel MOS field effect transistors to suppress a leakage of gate tunneling current and wherein said gates of said first and second n-channel MOS field effect transistors are doped with an n-type impurity and said gates of said first and second p-channel MOS field effect transistors are doped with an p-type impurity.

2. The semiconductor device as claimed in claim 1, wherein said first and second n-channel MOS field effect transistors have gate lengths that are smaller than gate lengths of said first and second p-channel MOS field effect transistors.

* * * * *